United States Patent [19]

Mehuys et al.

[11] Patent Number: 5,349,602
[45] Date of Patent: Sep. 20, 1994

[54] BROAD-AREA MOPA DEVICE WITH LEAKY WAVEGUIDE BEAM EXPANDER

[75] Inventors: David G. Mehuys, Menlo Park; Stephen O'Brien, Sunnyvale; David F. Welch, Menlo Park, all of Calif.

[73] Assignee: SDL, Inc., San Jose, Calif.

[21] Appl. No.: 31,684

[22] Filed: Mar. 15, 1993

[51] Int. Cl.$^5$ .............................................. H01S 3/08
[52] U.S. Cl. ......................................... 372/98; 359/344; 359/346; 372/50; 385/27; 385/43
[58] Field of Search .................... 372/6, 7, 43–46, 372/50, 92, 98, 99; 385/27, 39, 43, 50; 359/333, 341, 344, 346, 347, 348

[56] References Cited

U.S. PATENT DOCUMENTS

| | | | |
|---|---|---|---|
| 3,753,157 | 8/1973 | Ash et al. | 333/7 R |
| 3,898,585 | 8/1975 | Heidrich et al. | 331/94.5 |
| 4,063,189 | 12/1977 | Scifres et al. | 331/94.5 H |
| 4,087,159 | 5/1978 | Ulrich | 385/39 X |
| 4,348,763 | 9/1982 | Ackley et al. | 372/45 |
| 4,712,075 | 12/1987 | Snitzer | 359/341 |
| 4,715,672 | 12/1987 | Duguay et al. | 350/96.12 |
| 4,744,089 | 5/1988 | Montroll et al. | 372/50 |
| 4,745,607 | 5/1988 | Koch | 372/45 |
| 4,815,084 | 3/1989 | Scifres et al. | 372/46 |
| 4,860,298 | 8/1989 | Botez et al. | 372/45 |
| 4,912,523 | 3/1990 | Refi et al. | 455/607 |
| 4,985,897 | 1/1991 | Botez et al. | 372/50 |
| 5,063,570 | 11/1991 | Botez et al. | 372/50 |
| 5,101,413 | 3/1992 | Botez | 372/50 |
| 5,159,604 | 10/1992 | Mehuys et al. | 372/50 |
| 5,272,711 | 12/1993 | Mawst et al. | 372/45 |
| 5,276,700 | 1/1994 | Jansen et al. | 372/50 |

Primary Examiner—John D. Lee
Attorney, Agent, or Firm—Schneck & McHugh

[57] ABSTRACT

A coherent light source, such as a laser oscillator and a monolithic MOPA device, and a broad area light amplifying device, all characterized by having a leaky waveguide beam expander coupled thereto for expanding a single mode beam into a wide light beam in a coherent manner. The beam expander comprises an elongated antiguide core of a first refractive index and a radiated-wave receiving region of a higher refractive index to receive lightwaves laterally radiated from the antiguide core. This beam expander can be located at an output end of a single mode laser oscillator to receive and expand the beam, at an input end of a broad area optical power amplifier to allow the amplifier to accept a narrow input beam, or between the laser oscillator and power amplifier in a MOPA device. The beam expander elements can also be located partially or entirely within the resonant optical cavity of a laser oscillator.

27 Claims, 9 Drawing Sheets

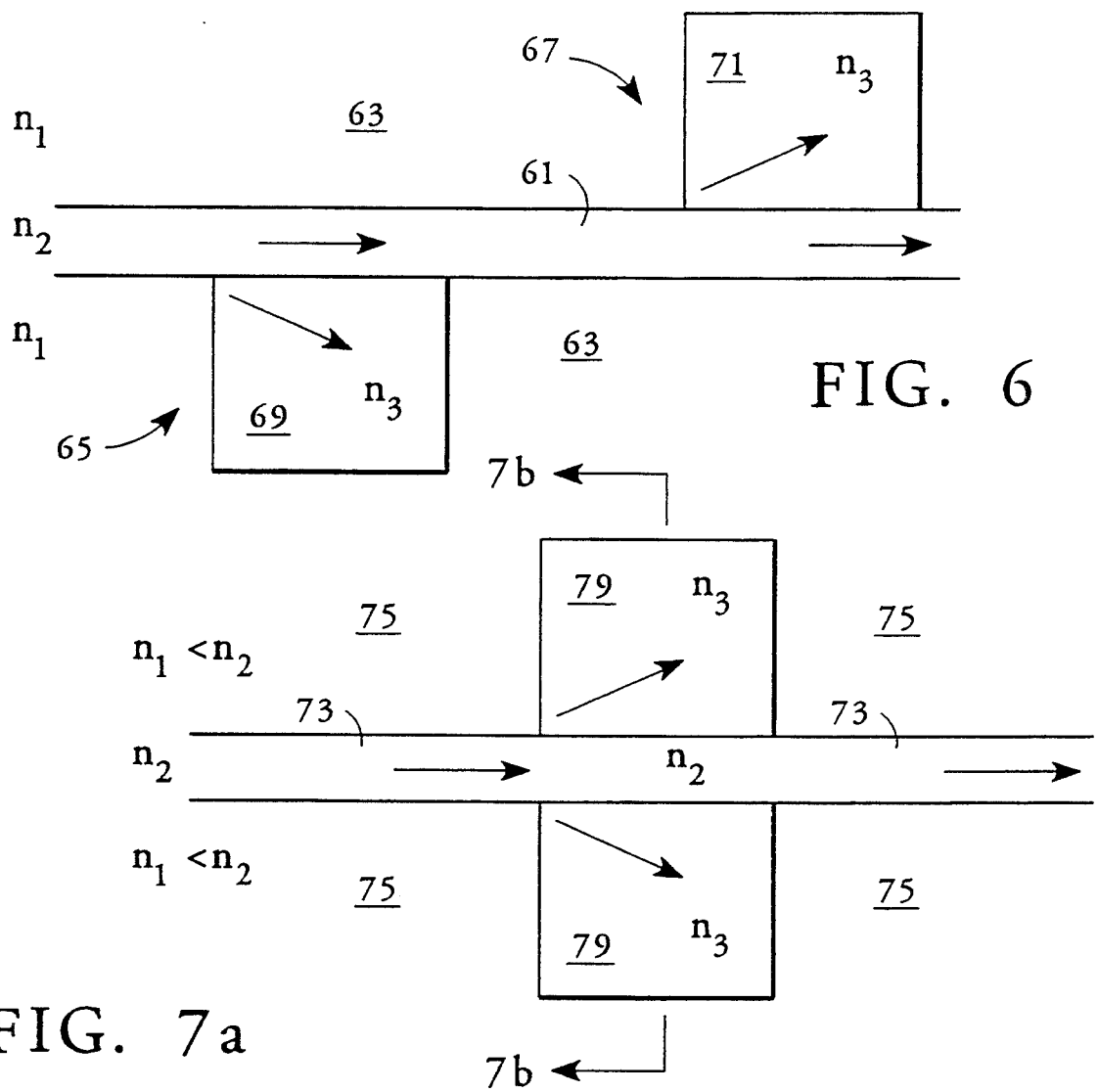
FIG. 6
FIG. 7a
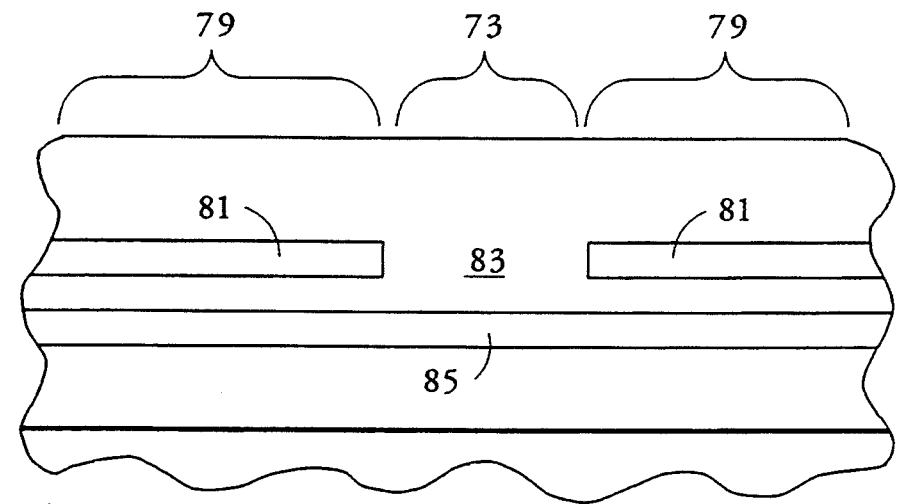
FIG. 7b

BROAD-AREA MOPA DEVICE WITH LEAKY WAVEGUIDE BEAM EXPANDER The invention was made with government support under contract no. F 30602-90-C-0104 awarded by the U.S. Air Force. The government has certain rights in the invention.

TECHNICAL FIELD

The present invention relates to broad-area semiconductor laser oscillators, traveling wave amplifiers and monolithic integrated master oscillator power amplifier (MOPA) devices. The invention also relates to transverse leaky waveguides or "antiguides".

BACKGROUND ART

It is difficult to maintain a single spatial mode of operation and a coherent single far-field diffraction-limited lobe in semiconductor lasers, amplifiers and MOPA devices to high output powers. In semiconductor lasers it has been found necessary to keep the waveguide width to less than 5 $\mu$m. Otherwise, multimode oscillation can occur at high pumping levels. Single stripe lasers are limited to single mode outputs of approximately 200 mW cw. Significantly higher powers are available from broad area lasers. For example, reliable operation to 1.0–1.5 W cw is available in broad area lasers with 100 $\mu$m emitting apertures. Unfortunately, such broad area lasers typically operate in multiple spatial modes, so the resulting beam is not diffraction limited.

High diffraction-limited powers have been obtained by injecting discrete broad area traveling wave amplifiers with a high power coherent beam from an external Ti:sapphire laser or dye laser. Using a Ti:sapphire laser as the master oscillator to inject a 0.5 W pulsed beam into a discrete broad area amplifier, an amplified output of greater than 21 W pulsed with a single diffraction-limited lobe was achieved. Fully monolithic structures replacing the external laser source with one that is integrated on the same substrate as the optical power amplifier have been demonstrated. The most successful monolithic MOPA structures to date have been those with a flared amplifier whose width increases from a narrow entrance aperture at the emitting end of the single mode laser oscillator to a significantly wider exit aperture. To preserve the single spatial mode received from the laser oscillator, the light is allowed to freely diffract within the flared amplifier, with the rate of increase of amplifier width coinciding with the divergence of the beam. Further, the intensity of the light received from the laser should be near the saturation intensity of the amplifier, with the power increasing along the length of the amplifier in a manner that maintains the intensity at or above the saturation level.

In U.S. Pat. No. 4,063,189, Scifres et al. describe a heterojunction diode laser that uses leaky wave coupling of light out of the laser active region through a thin confining layer to produce a high power, single transverse mode, large area, low divergence output beam. Several embodiments place the thin confining layer parallel to the active region layer, so that light is leaked transversely into the substrate at an angle to the rectifying junction of the laser. The substrate has a composition or heavy dopant concentration selected to minimize absorption at the lasing wavelength. In another embodiment, the thin optical confinement layer is located on the side of the active waveguide core and oriented perpendicular to the plane of the active region. In this latter embodiment, the light leaks laterally out of the waveguide. Because the optical power is extracted from an extended length of the active region, the output beam is spread out over a large area of the emitting surface of the laser diode.

In U.S. Pat. No. 3,753,157, Ash et al. describe a leaky wave coupler for transferring optical waves from one waveguide to another. The waveguides are two parallel longitudinal regions spaced apart from one another on the surface of a bulk material. The bulk material may be a slab of fused quartz. The waveguides may be lossless dielectric material, such as borosilicate glass, having a refractive index greater than that of the bulk material. A coupling region is positioned on the surface of the bulk material between the two waveguides in an area where coupling is desired. The coupling region may be a thicker layer of borosilicate glass than either waveguide, and thus has an even greater effective index of refraction than the two waveguides. Optical waves propagating in one waveguide approach that section of the waveguide which is adjacent to the coupling region. The lower phase velocity characteristic of the coupling region causes the waves to gradually leak from the waveguide into the coupling region. The leaky waves then traverse the coupling region and are coupled into the second waveguide in a reverse, but similar, manner. The result is strong coupling between the two waveguides even when the waveguides are not closely spaced. In another embodiment, the interguide region in the area where coupling is desired is a film layer that has a refractive index greater than that of the bulk material, but less than that of both waveguides. Sections of the waveguides are made with reduced refractive index, such as thin layers of borosilicate glass compared to the thicker layers in the remainder of the waveguides, so that light waves leak from one of these sections into the interguide film region and then into the corresponding section of the other waveguide. In yet another embodiment, both the waveguides and the coupling region between the waveguides could be made of an electro-optic material, such as $LiNbO_3$. Electrodes connected to the outside bulk material above and below the coupling region apply a controlled bias voltage in the coupling region. An electric field of one polarity in the electro-optic material increases the refractive index of the coupling region so that optical waves leak out of one waveguide and are conducted across the region to the other waveguide, while an electric field of the opposite polarity decreases the refractive index so as to prevent leaky wave coupling of the waveguides. Ash et al. also describe various leaky wave surface-to-bulk couplers using similar principals.

Ackley et al., in U.S. Pat. No. 4,348,763, and Botez et al., in U.S. Pat. No. 4,985,897, describe multistripe leaky mode or antiguided semiconductor laser arrays. In the lasers described by Ackley et al., multiple active stripe regions are separated by passive coupling regions. The passive coupling regions have a refractive index that is higher than the effective refractive index of the active stripe regions, so radiation leaks out of the stripe regions into the passive regions at a shallow angle, thereby providing optical coupling between neighboring stripe regions. In the lasers described by Botez et al., an array of negative-index waveguides or "antiguides" form the active lasing elements which are separated by interelement regions of higher refractive index. Some of the light propagating in the lower index antiguide elements will leak out into the interelement regions. The lateral spacing between active antiguide elements is selected to approximately equal an odd number of half-wavelengths in order to produce an array mode resonance condition in which there is strong coupling between all elements of the array, thereby creating a high degree of device coherence and a practically uniform near-field intensity distribution across the array. The lasers described by Botez et al. feature a monolithic structure of two such arrays longitudinally spaced apart on opposite ends of the structure and separated by a Talbot length, laterally unguided diffraction region. The two arrays are arranged relative to one another so as to operate at high power in a selected array mode (either in-phase or out-of-phase).

Scifres et al., in U.S. Pat. No. 4,815,084 describe a semiconductor laser with one or more optical elements integrated within the structure by means of boundaries of refractive index changes that are shaped and oriented to produce changes in shape of phase fronts of lightwaves propagating across the boundaries within the laser. In one embodiment, a boundary between the laser active region and a transparent window region is planar, but oriented askew, i.e. not parallel, relative to the cleaved end facet. Thus, the active region defines a prism, which can be used to deflect the laser beam, causing beam expansion.

An object of the present invention is to provide a monolithic broad area MOPA device capable of generating diffraction-limited outputs greater than 1.0 W cw.

Another object is to provide semiconductor laser oscillators capable of generating a broad area single spatial mode output at high power levels, as well as providing broad area traveling-wave optical power amplifiers capable of using their full width over their entire length for amplifying coherent light received from a laser source.

DISCLOSURE OF THE INVENTION

The above objects are met by incorporating a transverse leaky waveguide into a monolithic MOPA device between a single mode laser oscillator and broad area power amplifier for use as a coherent beam expander. The leaky waveguide has an elongated antiguide core and a radiated-wave receiving region of higher refractive index than the antiguide core laterally disposed along one side of the antiguide core. The antiguide core receives the light from the laser oscillator and then laterally radiates the light in a coherent manner along the length of the antiguide core into the radiated-wave receiving region, thereby expanding a narrow beam, typically of a single spatial mode, into a wide coherent beam for amplification by the broad area power amplifier. A tapered antiguide core produces a laterally radiated, expanded beam that diverges for suppressing optical filamentation. A wider antiguide core reduces radiation losses from the core, allowing greater beam expansion. The leaky waveguide beam expander can also be incorporated into a laser diode without an amplifier, either at the output end of the laser diode entirely outside the laser cavity, or partially within and partially outside of the laser cavity, or even entirely within the laser cavity, to form a laterally-emitting broad beam laser. Further, the leaky waveguide beam expander can be incorporated at the input end of a broad area optical power amplifier so as to be able to receive a high power laser beam from a discrete external laser source. Other embodiments are also possible, as described in the following detailed description of the best modes.

BRIEF DESCRIPTION OF THE DRAWINGS

FIG. 6 is a top plan view of a waveguide of the present invention having two one-sided leaky waveguide sections for mode filtering.

FIGS. 7a and 7b are, respectively, a top plan view and a sectional view taken along the line 7b—7b in FIG. 7a of another waveguide of the present invention having a two-sided leaky waveguide section.

BEST MODE FOR CARRYING OUT THE INVENTION

Figure 1:
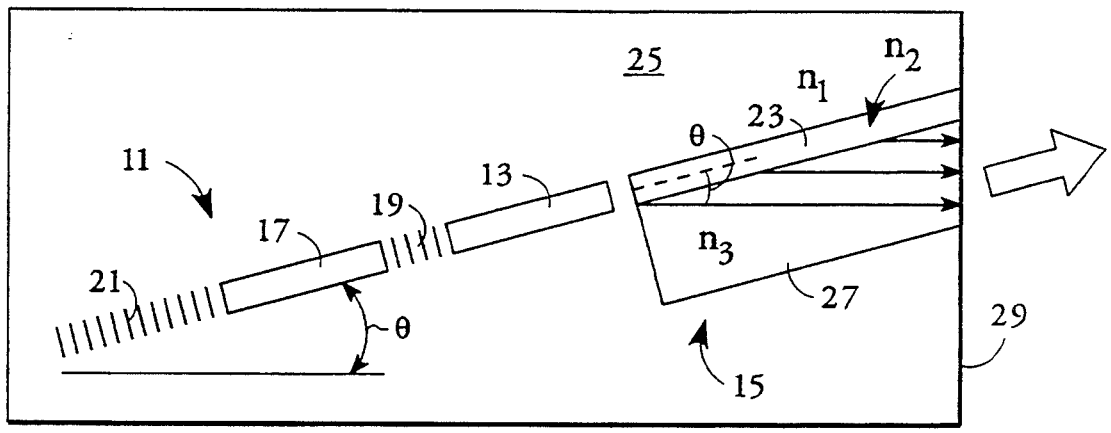
FIGS. 1-3 are top plan views of monolithic MOPA devices in accord with the present invention.

With reference to FIG. 1, a first monolithically integrated master oscillator power amplifier (MOPA) embodiment of the present invention includes a single-mode master-oscillator 11, such as a distributed Bragg reflector (DBR) laser, a single-mode amplifier stage 13 and a single-sided leaky waveguide coherent beam expander 15, all fabricated in a fully integrated structure. The output of the DBR laser 11 is injected into the amplifier stage 13 and subsequently coupled to the beam expander 15. The beam expander 15 uses a leaky waveguide 23 to radiate light laterally in a coherent manner out of one side 27 of the waveguide 23 at an angle $\Theta$ that is dependent on the change in refractive index across the beam expander region 15. As a result of this lateral radiation along the length of the beam expander's leaky waveguide 23, the spot size of the mode propagating in the MOPA is expanded from the narrow beam width (typically less than about 5 $\mu$m) received from the amplifier stage 13 to a width of about 100 $\mu$m or greater at the output facet 29.

The epitaxial structure of the MOPA device may be grown using a metal-organic chemical vapor deposition (MOCVD) process and may consist of a standard AlGaAs separate-confinement heterostructure with an $Al_{0.2}Ga_{0.8}As$ core and a single $In_xGa_{1-x}As$ ($x \approx 0.25$) quantum well centered in the active region. The first epitaxial growth includes an $Al_{0.5}Ga_{0.5}As$ n-cladding, the active region, and an $Al_{0.5}Ga_{0.5}As$ p-cladding.

Other semiconductor layer compositions and structures could also be used. The DBR laser 11 may be constructed by forming buried second-order gratings 19 and 21 near the active region in front and rear end sections bounding a central gain section 17 of the laser. Typically, the DBR laser includes a 500 μm long gain section 17 with front and rear grating lengths of 150 μm and 500 μm, respectively. Other dimensions are also possible. Both the DBR laser 11 and the amplifier stage 13 comprise a single real-refractive-index waveguide of about 3 to 5 μm stripe width. The amplifier stage 13 is typically about 500 μm long. The epitaxial structure described thus far and the processing steps used to form the DBR laser 11 and amplifier stage 13 of the MOPA device are well known.

The output of the amplifier stage 13 is injected into a beam expander 15. The leaky waveguide coherent beam expander 15 can be formed by creating a staircase-like profile for the lateral effective refractive index. As seen in FIG. 1, the beam expander 15 includes a waveguide cladding region 25 of a first refractive index $n_1$ on one side of a leaky waveguide core 23 of a second refractive index $n_2$ and a radiation receiving region 27 of a third refractive index $n_3$ on the leakage side of the waveguide core 23. The refractive indices are selected such that $n_1 < n_2 < n_3$. Typical values range from 3.30 to 3.34 for the first refractive index $n_1$ of the waveguide cladding region 25, 3.35 to 3.42 for the second refractive index $n_2$ of the leaky waveguide core 23, and 3.45–3.54 for the third refractive index $n_3$ of the radiation receiving region 27. Typically, $\Delta n = n_3 - n_2$ is in the range from 0.10 to 0.15. The angle $\Theta$ that the radiated wave makes with the optical axis (aligned with the waveguide 17 and 13 of the DBR laser and amplifier stage and also aligned with the leaky waveguide core 23 of the beam expander) is dependent on the effective refractive index $n_{\mathit{eff}}$ ($\approx n_2$) of the amplified mode propagating within the leaky waveguide core 23 and on the refractive index $n_3$ of the radiation receiving region 27, as defined by the relation: $\Theta = \cos^{-1}(n_{\mathit{eff}}/n_3)$. Typically, the radiation angle $\Theta$ ranges from 12° to 15°. Refractive indices and radiation angles outside of the typical ranges could also be used. In FIG. 1, the optical axis of the DBR laser 11, the amplifier stage 13 and the leaky waveguide core 23 of the beam expander 15 is oriented approximately at the radiation angle $\Theta$ away from the perpendicular to a natural cleavage plane of the heterostructure, so that the laterally radiated expanded beam can be accessed through an antireflection (AR) coated cleaved facet 29 at near perpendicular emission relative to the cleaved facet 29. In order to expand the beam width to approximately 100 μm, the beam expander 15 should be about 780 μm long.

Figure 4A:
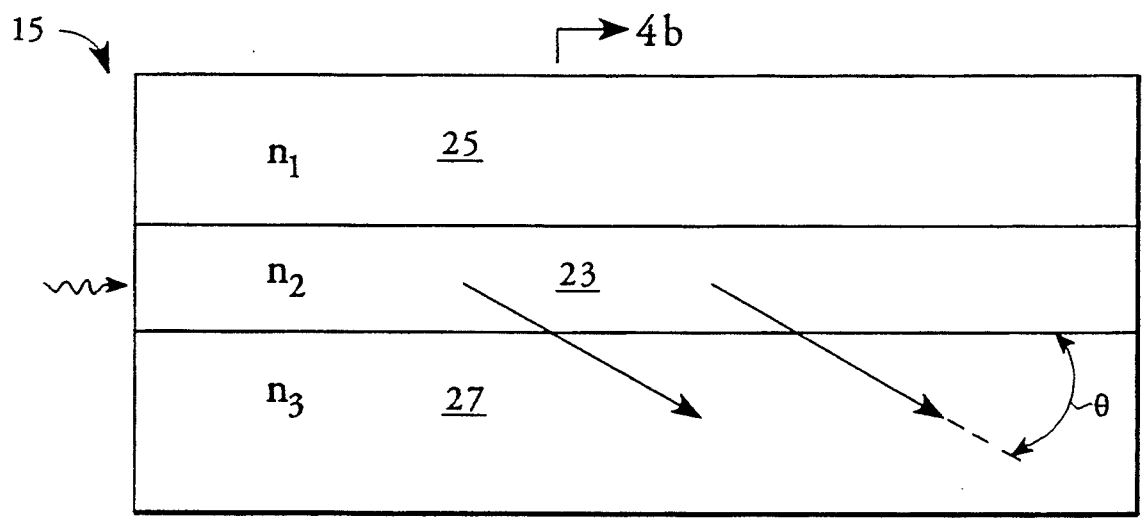
FIGS. 4a-c are, respectively, a top plan view, a sectional view taken along the line 4b—4b in FIG. 4a, and a graph of refractive index versus lateral position of a leaky waveguide beam expander of the present invention for use in any of the MOPA devices in FIGS. 1-3.
Figure 4B:
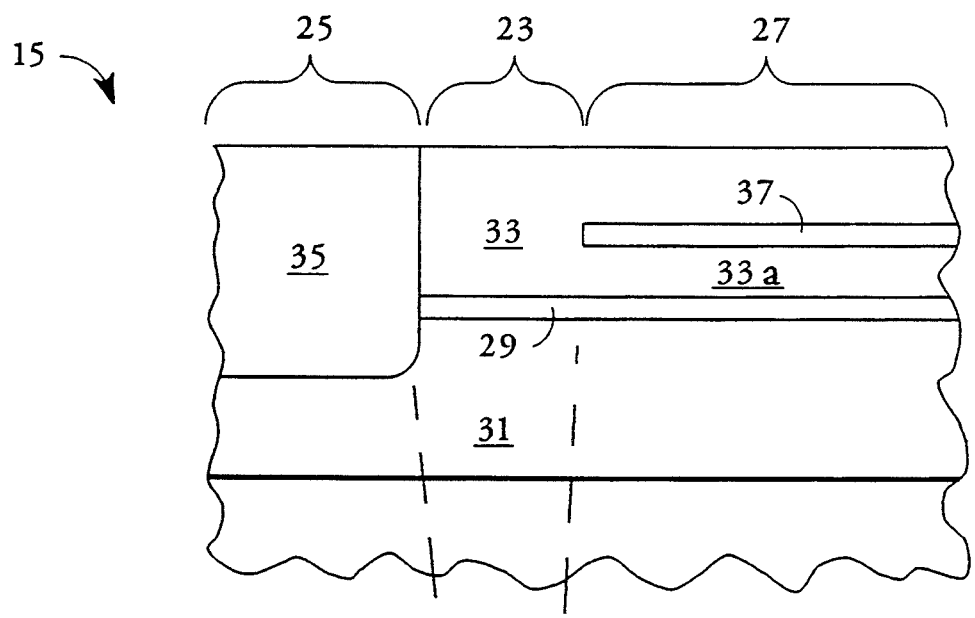
Figure 4C:
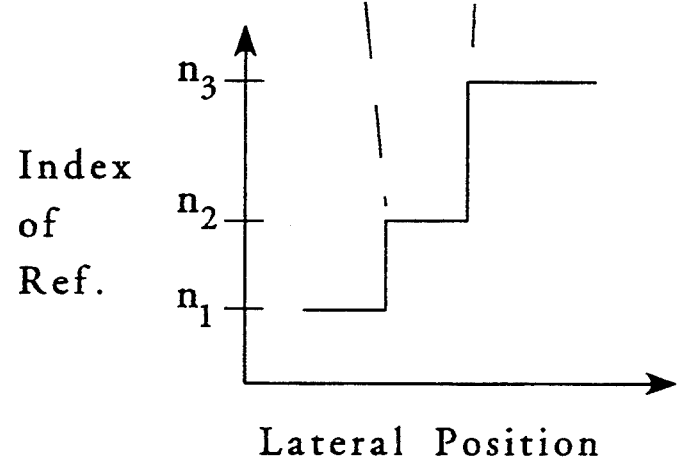

One method of creating the staircase-like refractive index profile of the beam expander 15 within a semiconductor heterostructure is illustrated in FIGS. 4a–c. The leaky waveguide core 23 of second refractive index $n_2$ comprises a semiconductor heterostructure with cladding layers 31 and 33 of AlGaAs disposed above and below an active region 29. The cladding region 25 of first refractive index $n_1 < n_2$ may comprise a diffused region 35 in which the active region 29 has been completely disordered by an impurity induced disordering (IID) process. Alternatively, the cladding region 25 may be formed by selective etching of the upper cladding layer 33, active region layers 29 and a portion of the lower cladding layer 31 in the cladding region 25 followed by regrowth of an $Al_yGa_{1-y}As$ cladding layer 35 in the etched area, where y is typically about 0.5 for relatively low refractive index compared to that of the active region 29 in the adjacent waveguide core 23. The radiation receiving region 27 of third refractive index $n_3 > n_2$ may be formed by depositing a thin, approximately 0.2 μm thick index loading layer 37 of GaAs near the active region 29 on a first p-cladding portion 33a, selectively etching away the GaAs layer 37 outside of the radiation receiving region 27 using a standard $NH_4OH/H_2O_2$ etchant and standard photolithographic masking. The doping and composition of the thin index-loading layers 37 can be varied, depending on the semiconductor material choice and on whether or not one wishes to pump the index loading regions 27. After the index loading regions 27 and the DBR laser's gratings 19 and 21 are formed, the p-side cladding and contacting layers 33 are regrown using an MOCVD process. The index of refraction profile shown in FIG. 4c of the resulting beam expander 15 results in single-sided emission of light into the radiation receiving region 27 at a radiated angle $\Theta$.

Standard p-metal lift-off and proton implant techniques may be used to contact the DBR laser's gain section 17, the amplifier stage 13 and the central core region 23 of the beam expander 15 to an electrical bias voltage so that electric current may be injected into each element. Current may also be injected into the index loading regions 27 to change the effective refractive index $n_3$ of those regions. The MOPA device is mounted p-side down on a heatsink. Copper heatsinks may be used for efficient heat removal (Copper has a thermal conductivity of about 4 W/cm.). Diamond submounts can be affixed to the copper heatsink in order to increase the thermal conductivity. Thermal conductivities for three types of commercially available diamond submounts are 10–15 W/cm for polycrystalline CVD-grown diamond, 20 W/cm for type 2A natural diamond, and 30–35 W/cm for single-crystal CVD-grown diamond. The increased thermal conductivity also leads to a smaller lateral temperature gradient across the gain area, reducing thermal lensing effects. Either the submount or the heatsink itself can be patterned with grooves positioned at the edges of the gain areas of the MOPA structure to force one-dimensional heat flow and thereby prevent the side-spreading of heat within the heatsink that leads to thermal gradients. Such grooves can be fabricated within the diamond submount by either laser cutting or ion milling.

All of the MOPA components may be driven in parallel by a common bias voltage. This mode of operation is particularly convenient when no diamond submount is employed and the MOPA device is mounted directly to a single copper heatsink. The current injected into each element is then determined strictly by the bias voltage and the relative resistances of the components. Alternatively, each MOPA component, or even different portions of a single component, can be driven independently by separate current sources. This is easiest to implement when the electrically insulative diamond submount is used. The current to each section can then be adjusted or varied separately from the other to optimize the output or to produce modulation of the output power.

If the current applied to the leaky waveguide core 23 of the beam expander 15 is varied, either intentionally or as a consequence of a variation of a common bias voltage shared with the laser 17 and amplifier 13 stages, the output direction of the beam changes slightly. The beam steering is caused by the dependence of the refractive index $n_2$ in the central core region 23 of the beam expander 15 upon the carrier density. The refractive index $n_2$ decreases with increasing current density, causing the lateral radiation angle $\Theta$ to increase and steering the beam away from the normal to the output facet 29. A carrier density change of about $10^{18}$ cm$^{-3}$ in the waveguide core 23 yields a refractive index change $\Delta n_2$ of about $10^{-3}$, corresponding to a 1.5 mrad steering of the lateral radiation angle $\Theta$ within the heterostructure and an observed 0.3° steering in air of the output beam.

In actual operation, the monolithically integrated laser, preamplifier and beam expander of FIG. 1 has been found experimentally to exhibit a threshold current of about 65 mA, a slope efficiency of 0.3 W/A, a sudden turn-on behavior characteristic of unpumped grating regions 19 and 21 in the DBR laser 11 acting as a saturable absorber. The device has further been observed to operate in a single longitudinal mode with optical emission at approximately 1009.4 nm up to power levels of at least 115 mW. The observed near-field intensity pattern across the output facet 29 is relatively smooth with the $1/e^2$ points indicating a beam width of approximately 100 μm. Thus, the beam expander 15 has transformed the approximately 4 μm wide mode injected from the transverse waveguide of the DBR laser 11 and amplifier stage 13 into a 100 μm wide output beam. It should be noted that a relatively uniform near-field intensity pattern across the output facet 29 will only be achieved if the beam expander's leaky waveguide core 23 is sufficiently pumped with injected current to compensate for the significant power loss in the waveguide core 23 due to the lateral radiation. If the waveguide core 23 is merely pumped to transparency, the amount of laterally radiated power will be approximated by an exponential decay with distance along the length of the leaky waveguide 23. The observed transverse far-field intensity pattern, parallel to the pn junction of the MOPA's heterostructure, for the expanded beam exiting the output facet 29 consists primarily of one diffraction-limited main lobe 0.6° wide up to output power levels of at least 70 mW. The width of this observed far-field pattern indicates that the expanded beam is coherent over the entire 100 μm wide emitting aperture. Although two secondary side lobes also exist, these are observed to be down in power by approximately $-14$ dB. At least 80% of the total power is contained within the main lobe for a Strehl ratio greater than 0.8.

Figure 2:
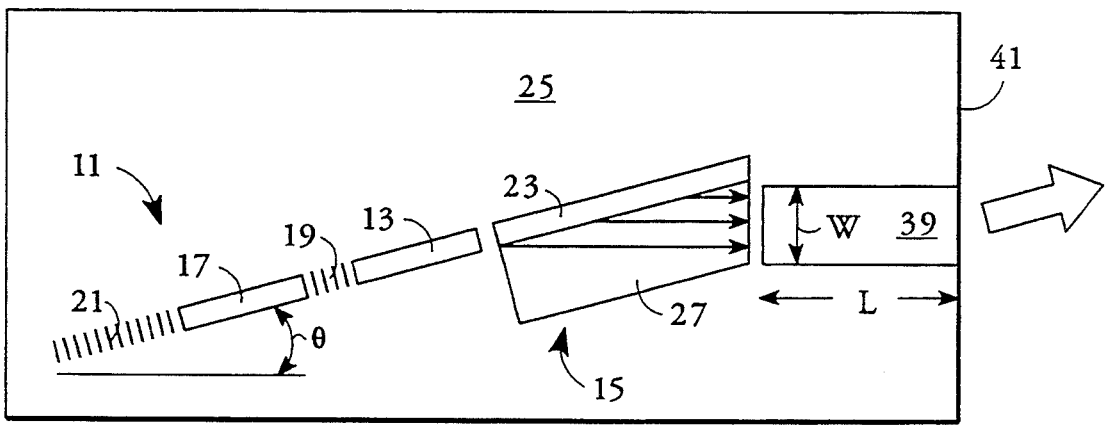

With reference to FIG. 2, higher output powers can be achieved in a second monolithic MOPA embodiment of the present invention having a broad area power amplifier 39 integrated into the MOPA heterostructure. As in the MOPA of FIG. 1, the second MOPA embodiment shown in FIG. 2 includes a single mode DBR laser 11, formed with buried second-order gratings 19 and 21 bounding a central gain section 17, a single mode amplifier stage 13, optically coupled to the DBR laser 11 and serving here as a pre-amplifier, and a coherent beam expander 15, optically coupled to the pre-amplifier 13 and comprising a leaky waveguide core 23 bounded on one side by a lower index cladding region 25 and on the other side by a higher index radiation receiving region 27. In addition to these components, the MOPA device of FIG. 2 also includes a broad area power amplifier 39 that is positioned to receive the laterally radiated expanded beam from the beam expander's radiation receiving region 27.

Typical dimensions for the DBR laser 11 are 500 μm and 150 μm for the length of the rear and front gratings 21 and 19, 500 μm for the length of the central gain section 17 and 3 to 5 μm for the mode width of the single mode waveguide. For a beam radiation angle $\Theta$ of from 12° to 15°, the beam expander 15 should be about 800 μm long to expand the 4 μm wide mode injected into the beam expander 15 from the preamplifier 13 more than 30-fold to about 130 μm. The broad area power amplifier 39 is typically about 750 μm long and at least 130 μm wide. A 150 μm wide power amplifier 39 is typical to prevent degradation of the lateral edges of the 130 μm wide beam. As before, the optical axis of the laser 11, preamplifier 13 and leaky waveguide core 23 is oriented about 15° from perpendicular to a natural cleavage plane so the expanded and amplified beam from the broad area amplifier 39 can be accessed through a cleaved antireflection (AR) coated facet 41. A MOPA device constructed in accord with this second embodiment was observed experimentally to produce a relatively smooth and uniform near-field intensity pattern characterized by a 130 μm beam width and a far-field pattern characterized in a plane parallel to the pn junction of the MOPA's heterostructure by a single diffraction-limited 0.45° wide lobe in a single spectral and spatial mode up to at least 800 mW output power.

Figure 3:
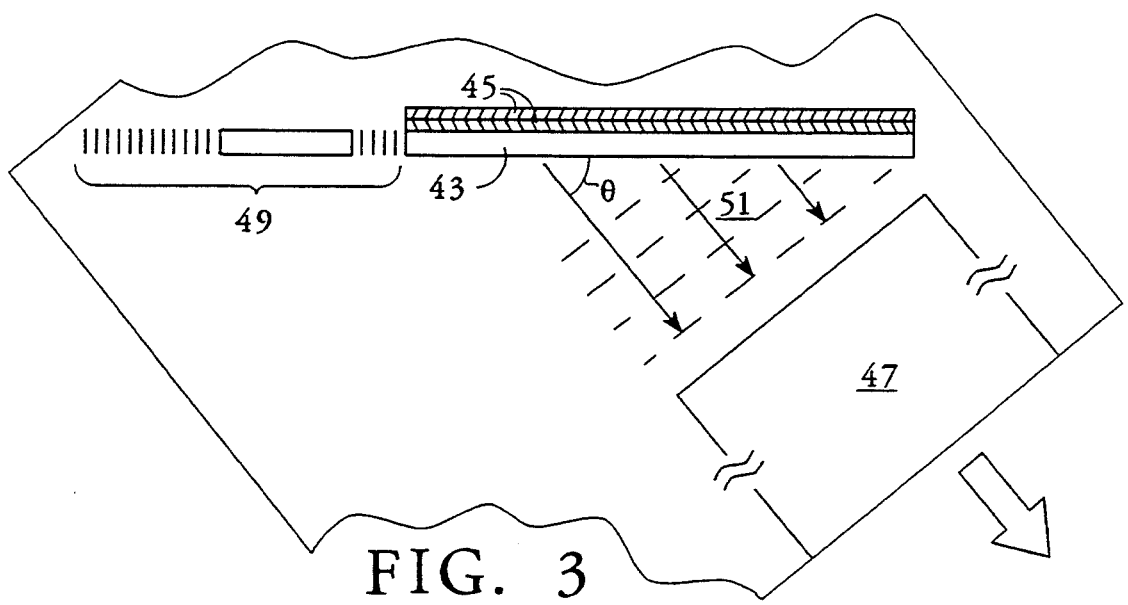

With reference to FIG. 3, a third monolithic MOPA embodiment of the present invention employs a single-mode antiguide (leaky-wave) amplifier 43 with antiresonant layers 45 on one side to inject an expanded beam into a broad area amplifier 47 for high coherent output power. In this configuration, a single-mode master oscillator 49, such as a DBR laser, is used to inject light into the single-mode antiguide amplifier 43. The antiguide amplifier 43 is pumped so as to amplify the light received from the laser 49, but at the same time it generates an expanded traveling wave with planar phase fronts which radiates at an angle $\Theta$ to the optical axis defined by the single mode waveguide of the laser 49 and amplifier 43. Typically, this radiation angle $\Theta$ is about 15°. The laterally radiated light can be subsequently amplified by the broad area amplifier 47 through which it passes.

Figures 5A, 5B:
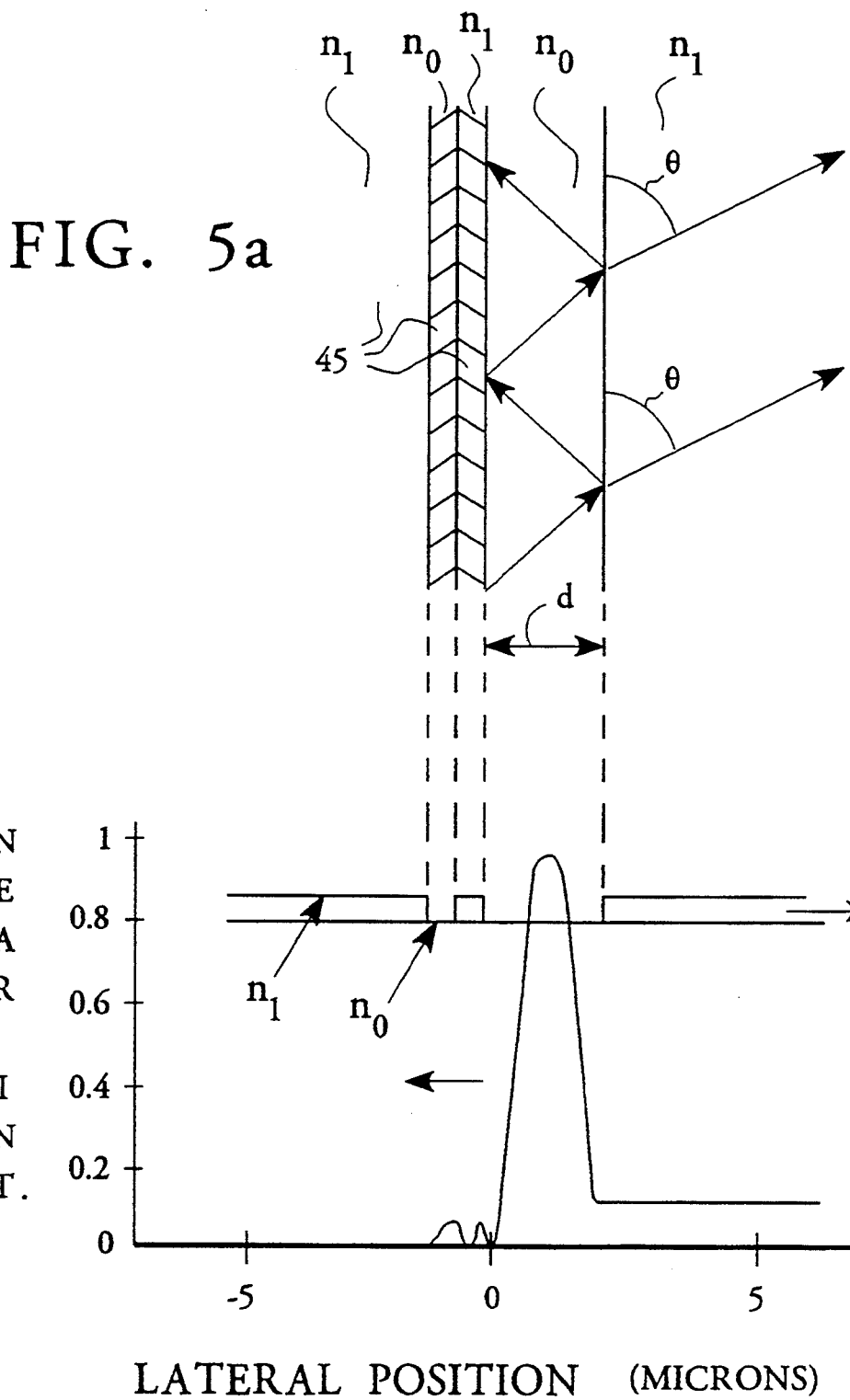
FIGS. 5a and 5b are, respectively, a top plan view and a graph of both near-field light intensity and refractive index versus lateral position of an alternative leaky waveguide beam expander of the present invention.

The single-mode antiguide amplifier 43 with antiresonant layers 45 on one side is shown in FIGS. 5a and 5b. The antiguide amplifier 43 comprises a waveguide of a first refraction index $n_0$. A radiation receiving region 51 of a second refractive index $n_1 > n_0$ is disposed adjacent to the waveguide 43. Because the refractive index $n_1$ of the radiation receiving region 51 is higher than the refractive index $n_0$ of the waveguide 43, lightwaves injected into the waveguide 43 gradually leak out into the radiation receiving region 51 as they propagate along the leaky waveguide 43. The angle $\Theta$ that the radiated wave makes with the optical axis (defined along the length of the leaky waveguide 43) is dependent on the effective refractive index $n_{eff} \approx n_0$ of the amplified mode in the leaky waveguide 43 and the refractive index $n_1$ in the radiation receiving region 51 according to the relation: $\Theta = \cos^{-1}(n_{eff}/n_1)$. For typical refractive index values, $n_0 = 3.42$, $n_{eff} = 3.4114$, $n_1 = 3.54$, the radiated angle $\Theta$ is approximately 15°. The antiresonant layers 45 on the opposite side of the leaky waveguide 43 from the radiation receiving region 51 are of alternating higher and lower refractive indices and are of width $w = (k + \frac{1}{2})\lambda_T/2$, where k is an integer, $\lambda_T$ is the lateral wavelength of the lightwaves in each antiresonant layer. The lateral wavelength $\lambda_T$ is approximately $$\lambda_T \approx \frac{\lambda}{\sqrt{n_1^2 - n_0^2 + (\lambda/2d)^2}}$$

where $\lambda$ is the wavelength in vacuum and d is the width of the antiguide waveguide of refractive index $n_0$ in FIG. 5b. The antiresonant layers reflect the lightwaves radiated to that side of the antiguide core 43, so that the lateral radiation is to one side only, namely into the receiving region 51. FIG. 5b shows the calculated near-field intensity pattern of light propagating along the antiguide amplifier 43 and leaking into the radiation receiving region 51. A single-sided radiation leakage of about 200 cm$^{-1}$ is enough to generate a high intensity radiated and expanded beam which saturates the subsequent broad area amplifier 47 in FIG. 3.

Either of the leaky waveguide structures depicted in FIGS. 4a–c and FIGS. 5a–b can also be used as a mode filter, which might be fabricated into a semiconductor laser structure. In this instance, instead of using the laterally radiated expanded beam that has been leaked coherently from the leaky waveguide, use of the optical mode that remains in the leaky guide is contemplated. Either one-sided or two-sided leaky waveguides can be fabricated. FIG. 6 shows an example of a structure having a waveguide 61 of refractive index $n_2$ clad on each side by regions 63 of lower refractive index $n_1$ along most of the length of the waveguide 61, and also having two one-sided leaky guide sections 65 and 67 in which one side of the waveguide is bounded by a region 69 and 71 of higher refractive index $n_3 > n_2$. FIG. 7a shows an example of a structure having a waveguide 73 of refractive index $n_2$ clad on each side by regions 75 of lower refractive index $n_1$ along most of the length of the waveguide 73 and also having a two-sided leaky guide section 77 in which both sides of the waveguide 73 is bounded by regions 79 of higher refractive index $n_3 > n_2$. As previously described for the leaky waveguide beam expanders, such transverse leaky guides can be fabricated, for example, by loading one or both sides of the waveguide core region 61 or 73 with a buried layer of GaAs to increase the effective refractive index of the side regions 69, 71 or 79. A sectional view of the resulting epitaxial structure for the two-sided leaky waveguide case of FIG. 7a is shown in FIG. 7b. There it is seen that an index loading layer 81 has been grown in side regions 79 over a portion of the upper cladding layer 83 in close proximity to the active region 85, but has been removed from the central waveguide core region 73. The index loading layer 81 is typically GaAs, but can also consist of different compositions of semiconductors to yield a higher refractive index.

In a leaky waveguide, the rate of loss $\alpha_m$ for each of the modes is approximated by the relationship:

$$\alpha_m = \frac{m^2 \lambda^2}{2w^3 n_2 (n_3^2 - n_2^2)^{\frac{1}{2}}},$$

where m is the order of the mode, $\lambda$ is the wavelength of light, w is the width of the guide and $n_x$ is the refractive index of layer x. The amount of power radiated out of the guide can be seen to be least for the fundamental mode (m=1) and to increase strongly for the higher order modes (m>1). For example, the relative loss of the first order mode ($e^{-\alpha_1 L}$) and the ratio of the loss of the second order mode to the loss of the first order mode ($e^{(\alpha_1 - \alpha_2)L}$) for a 60 μm long leaky waveguide section (L=60 μm) are shown in the following table. Since the amount of loss is sensitive to the waveguide width w, the results are shown for three different widths. Values of $\lambda = 1.0$ μm, $n_2 = 3.43$ and $n_3 = 3.58$ are assumed for the calculations.

| w | $\alpha_1$ | $\alpha_2$ | $e^{-\alpha_1 L}$ | $e^{(\alpha_2 - \alpha_1)L}$ |
|---|---|---|---|---|
| 3.0 μm | 53 cm$^{-1}$ | 212 cm$^{-1}$ | 0.73 | 2.6 |
| 3.5 μm | 33 cm$^{-1}$ | 132 cm$^{-1}$ | 0.82 | 1.8 |
| 4.0 μm | 22 cm$^{-1}$ | 88 cm$^{-1}$ | 0.88 | 1.5 |

For a typical waveguide of 3.5 μm width, the fundamental mode experiences a single-pass loss of only 18%, while the second order mode suffers a loss of 55%. Thus, the leaky guides can serve as mode filters to provide a significantly higher loss for the higher order modes, while minimizing the loss for the first order or fundamental mode. This significant differential loss can be of significant value in applications where the appearance of second and third order modes is prevalent and undesired. For example, integrating such a leaky waveguide mode filter into a semiconductor laser structure would improve mode quality in instances where multimode operation is a problem.

Figure 8:
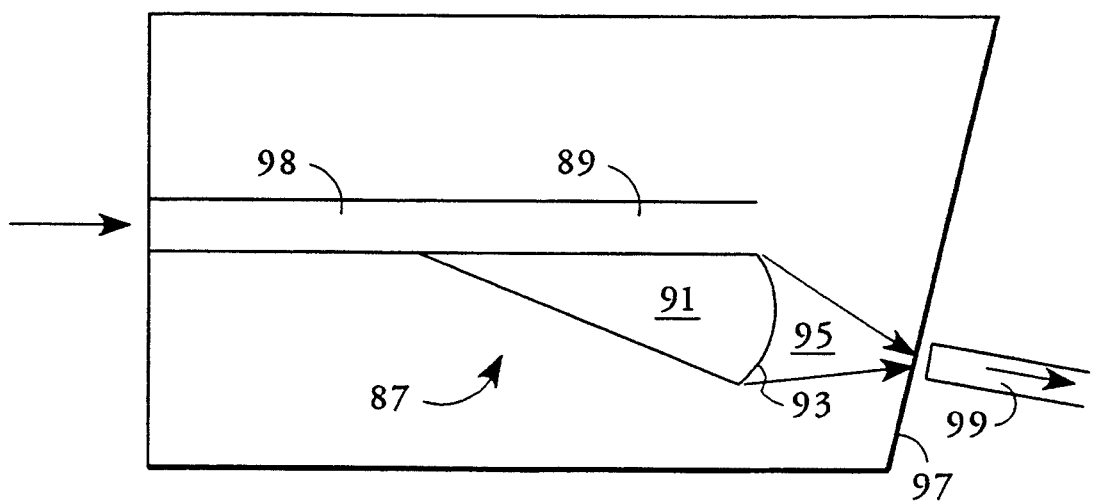
FIGS. 8-10 are top plan views of alternative waveguide configurations of the present invention containing leaky waveguide beam expanders like those in FIGS. 4a-c and FIGS. 5a-b.
Figure 9:
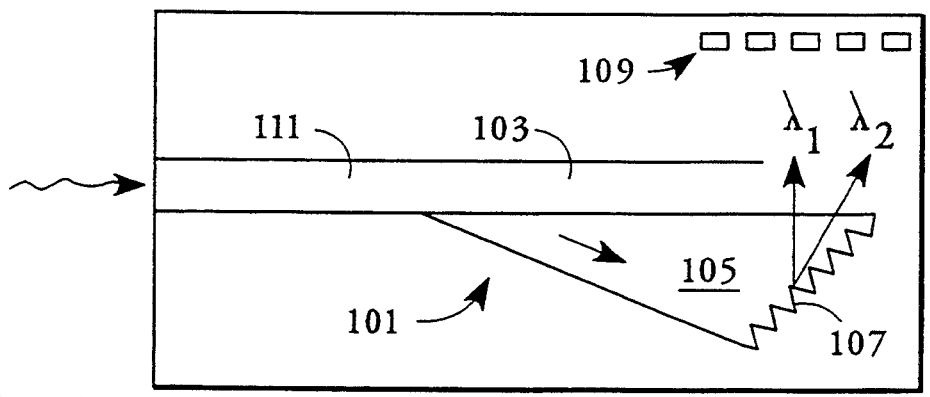
Figure 10:
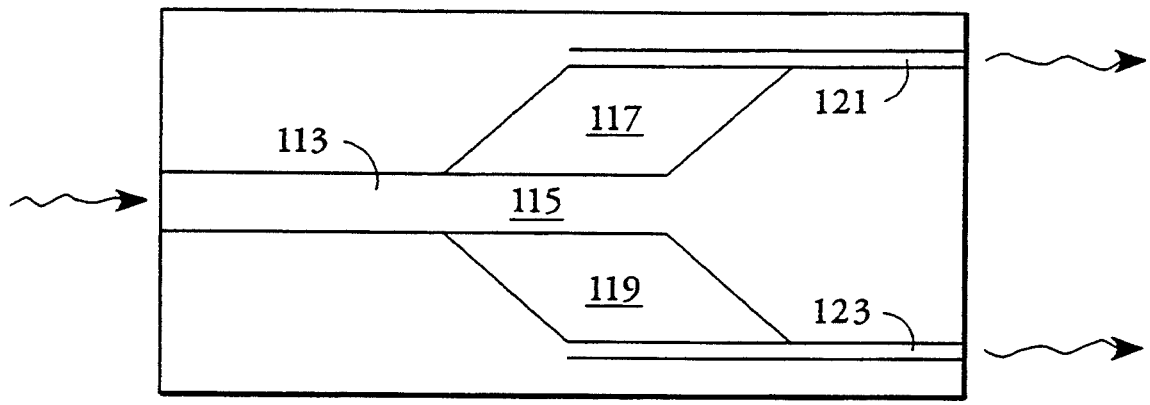

With reference to FIGS. 8–10, other devices employing coherent beam expanders of the leaky waveguide type can be fabricated. In FIG. 8, a coherent beam expander 87 has a leaky waveguide core 89 and a higher refractive index, lateral radiation receiving region 91 on one side of the leaky waveguide core 89. The other side of the leaky waveguide core 89 can either be a cladding region as in FIGS. 4a–c or a series of antiresonant layers as in FIGS. 5a–b. The output end 93 of the radiation receiving region 91 can be shaped or contoured to act as a lens. This output end 93 can be an etched or ion milled surface of a heterostructure containing the beam expander, in which case the surface forms a refractive index boundary at the interface of the radiation receiving region 91 with the surrounding environment 95, such as air. Alternatively, the output end 93 of the radiation receiving region 91 can be an integrated refractive index boundary between the radiation receiving region 91 and another region 95 of the heterostructure with a different refractive index, as shown. In that case, a planar cleaved output facet 97 can be formed beyond the integrated refractive index boundary 93. Boundary 93 can either be simply curved, as shown, or formed as a Fresnel lens. In any of these configurations, the broad area light in the radiation receiving region 93 is focussed to a high brightness spot which may match the admitting aperture of another optical element 99. This element can be integrated onto the same chip or could be external to the chip. The radiation receiving region 91 of the beam expander 87 can be electrically pumped to amplify the output power of the beam to be focussed.

In one application, the output of a first single mode waveguide 98 injects light into the leaky waveguide 89 of the beam expander 87, while the radiation receiving region 91 of the beam expander 87 with lensed output 93 focusses the light into the input of another single mode waveguide 99 that is oriented at an angle to the first waveguide 98. Either or both of the waveguides 98 and 99 can be optical fibers external to the heterostructure containing the beam expander 87 or can be integrated waveguides formed in the heterostructure.

In FIG. 9, the beam expander 101 again has a leaky waveguide 103 bounded on one side by an adjacent lateral radiation receiving region 105 of higher refractive index than the waveguide 103. The output of the radiation receiving region 105 is patterned with a grating 107 such that the laterally radiated expanded light beam is diffracted by the grating 107 at an angle associated with its wavelength. The grating 107 may be formed on an edge surface of the heterostructure containing the beam expander 101 with its teeth oriented perpendicular to the pn junction plane of the heterostructure, as shown, for in-the-plane diffraction. The grating 107 can be either reflective, as shown, or transmissive of the incident laterally radiated light. A detector array 109 can be integrated into the device in the path of the diffracted light, where each element of the detector array 109 receives a different wavelength $\lambda_1$, $\lambda_2$, etc. from the grating 107. The purpose of the beam expander 101 is to increase the width of the light injected into the leaky waveguide 103 by a single mode waveguide 111, so that the expanded light beam is incident upon more grating teeth and better resolution is obtained. The beam expander 101 with grating 107 and detector array 109 form a monolithic spectrum analyzer. The single mode waveguide 111 can be either an external optical fiber or integrated into the heterostructure. In an alternative configuration, a set of single mode waveguides could be positioned to receive diffracted light of different wavelengths from the grating 107. This type of device would be useful for multiplexing or demultiplexing multiwavelength sources.

In FIG. 10, a single mode waveguide 113 injects light into a leaky waveguide 115 that is bounded on both sides by lateral radiation receiving regions 117 and 119. This double-sided beam expander may be formed like the double-sided mode filter shown in FIGS. 7a–b except that here the laterally radiated light is used rather than the mode that remains in the leaky waveguide 115. Two additional single mode waveguides 121 and 123 adjoin the ends of the radiation receiving regions 117 and 119. In this fashion, an equal amount of optical power can be coupled from a single waveguide 113 into two other waveguides 121 and 123. Branching can be achieved in this configuration with less power loss as compared to waveguide Y-junction configurations. In any arrangement in which a leaky waveguide beam expander is used to coupled light from one single mode waveguide 113 into broad receiving regions 117 and 119 then back into other single mode waveguides 121 and 123, the length of the interacting sections should be optimized to ensure that the light, once coupled into a second waveguide 121 or 123 is not reradiated by continued interaction back into the broad region 117 or 119. If the length of the coupling region is too long, the coupled power begins to experience a significant loss.

Figure 11:
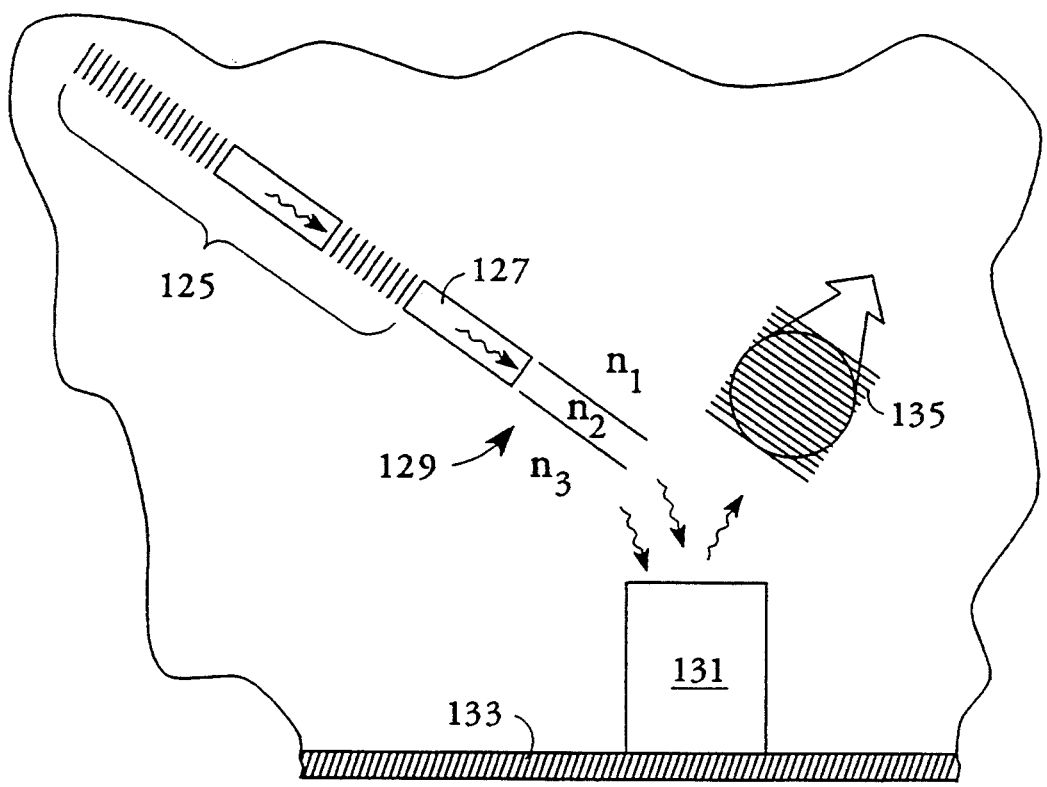
FIGS. 11 and 12 are top plan views of further MOPA device embodiments of the present invention.

With reference to FIG. 11, another monolithic MOPA embodiment with antiguide (leaky waveguide) beam expander is shown. This embodiment has a single mode master oscillator 125, such as a DBR laser, a single-mode pre-amplifier stage 127 receiving the coherent light output from the laser 125, a single-sided antiguide beam expander 129, such as the type of beam expander depicted in FIGS. 4a–c, injected with the amplified mode from preamplifier stage 127, and a broad area power amplifier 131 positioned to receive the laterally radiated expanded beam from the beam expander 129. In this embodiment, the far end of the broad area amplifier 131 furthest from the beam expander 129, which in the embodiments shown in FIGS. 2 and 3 forms the output end of the amplifiers 39 and 47, is bounded by a high reflection (HR) coated facet 133. The HR coated facet 133 causes laterally radiated light from the beam expander 129 that has been amplified by passage once through the broad area amplifier 131 to be reflected and to pass a second time through the amplifier 131 for further optical power amplification. After passing twice through the broad area amplifier 131, the light can be coupled out of the heterostructure by any of a number of known means. For example, in FIG. 11, a surface emitting detuned grating output coupler 135 in the path of twice amplifier light from the broad area amplifier 131 may be used to couple the light vertically through a top or bottom surface of the heterostructure.

Figure 12:
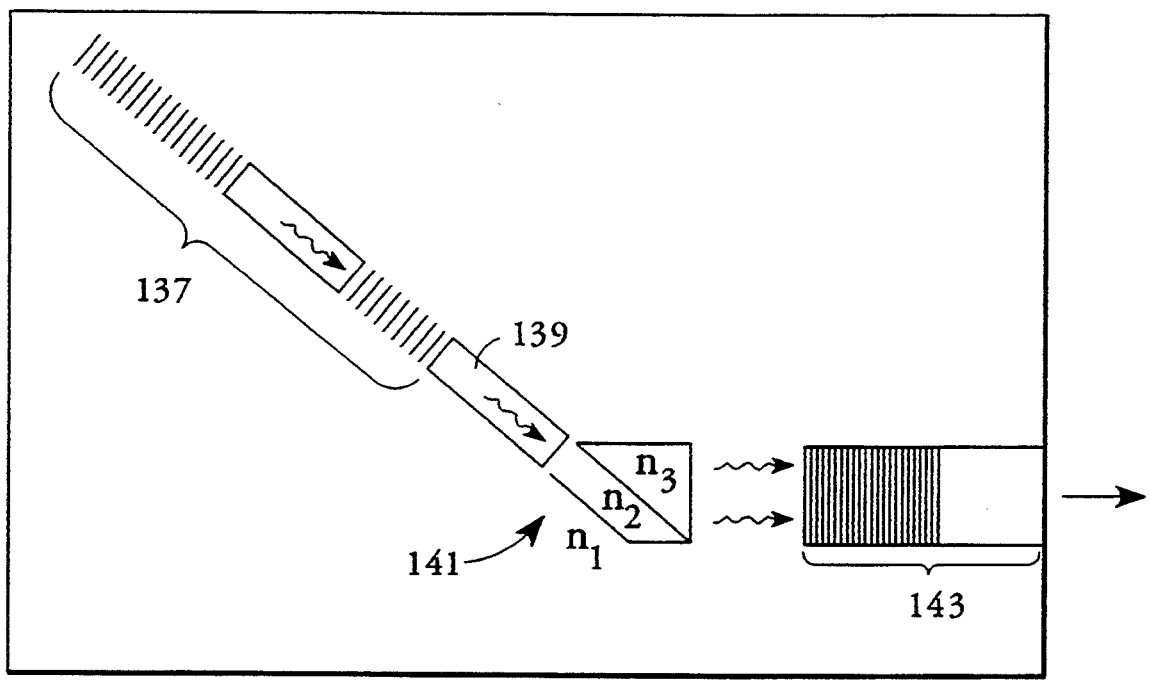
Figure 13A:
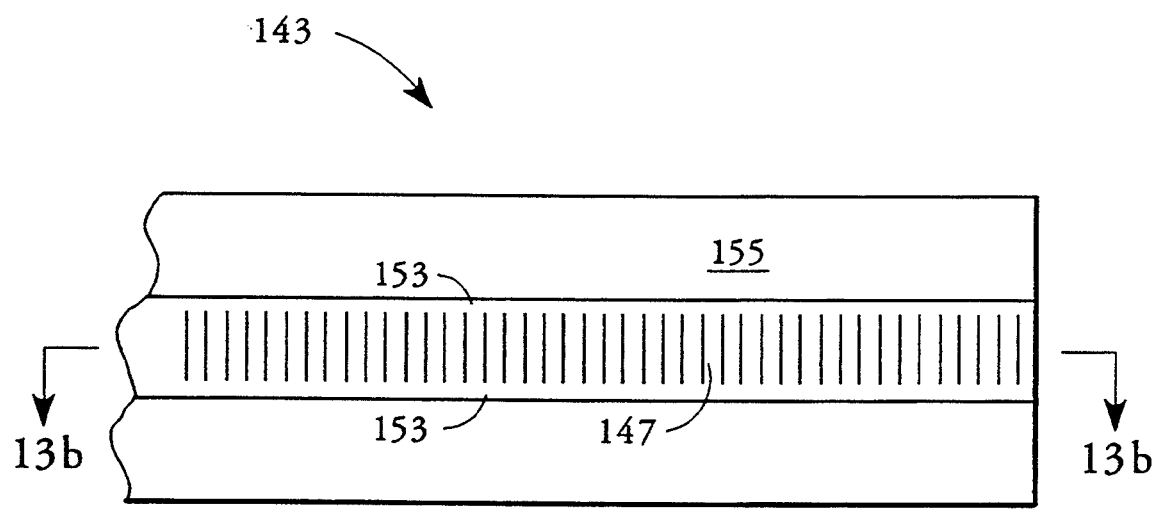
FIGS. 13a and 13b are, respectively, a top plan view and a sectional view taken along the line 13b—13b in FIG. 13a of an active grating amplifier for use in the MOPA device of FIG. 12.
Figure 13B:
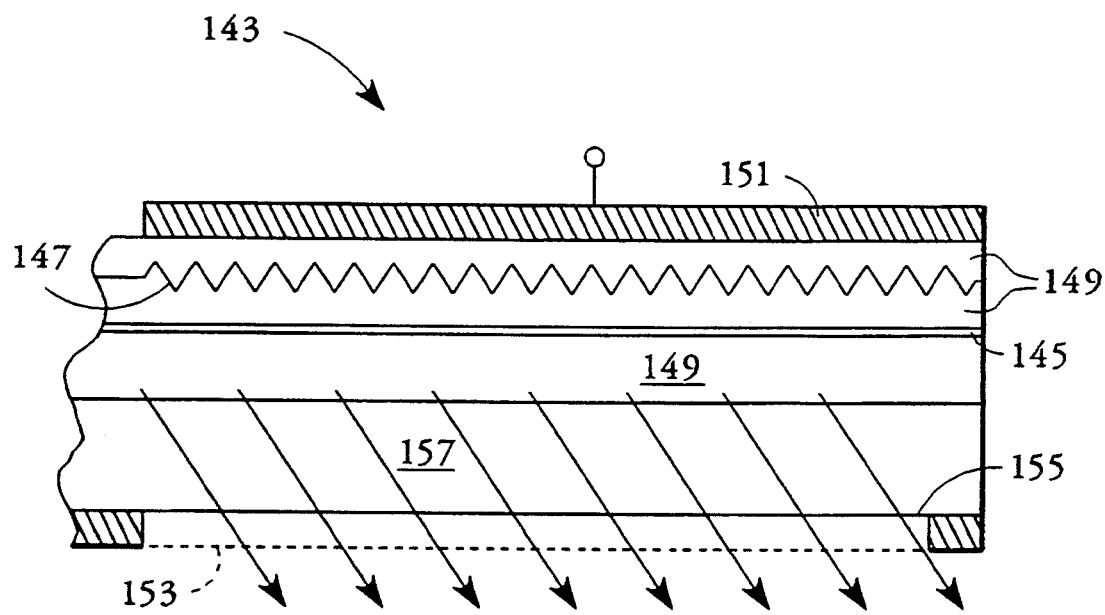

With reference to FIG. 12, another MOPA device has a master oscillator 137, a preamplifier stage 139, a single-sided antiguide beam expander 141 like that shown in FIGS. 4a–c, and a broad area power amplifier 143, all arranged and integrated monolithically like the MOPA embodiment in FIG. 2. However, here the power amplifier 143 is an active grating amplifier for simultaneous amplification and surface output coupling. Such a broad area active grating amplifier is shown in FIGS. 13a and 13b. The amplifier 143 preferably comprises a heterostructure with, for example, an InGaAs quantum well active region 145 clad by layers 149 above and below the active region 145 formed over a GaAs substrate 157. Other types of active region are also possible. A detuned second order grating 147 is disposed between two adjacent cladding layers 149 in close proximity to the plane of active region 145. The grating 147 generally has a length of 500 μm or more and a width of 100 μm or more, the width of the grating 147 coinciding with or being slightly larger than that of the expanded beam received from the beam expander 141 seen in FIG. 12. Typically, the broad area amplifier 143 containing the grating 147 is about the same length and about twice the width of the grating 147 and extends beyond both side edges of the grating 147 to permit electrical pumping of the amplifier 143 without obstructing the surface emitted output from the grating 147. The p-side of the heterostructure is metallized with a conductive contact 151 on top of the grating 147 so that light amplified in the quantum well 145 is diffracted through the substrate 157. A AR-coated window 155 is formed beneath the grating 147 in the conductive contact 153 on the surface of the substrate 157 through which the output light is radiated.

In operation, the master oscillator 137 in FIG. 12 supplies about 100 to 150 mW of optical power to the pre-amplifier stage 139 which in turn increases the power to about 200 mW to 300 mW or more, which is sufficient to saturate the broad area amplifier 143. The antiguide beam expander 141 provides a laterally radiated coherent beam of 100 μm width or more to the broad area active grating amplifier 143. At least 10 W of optical power can be emitted through the window 155 in the substrate surface. The emission is diffraction-limited, because the light intensity and carrier density are clamped within the active grating along the amplifier length, leading to uniform modal index and a constant angle of diffraction from the grating 147.

Figure 14:
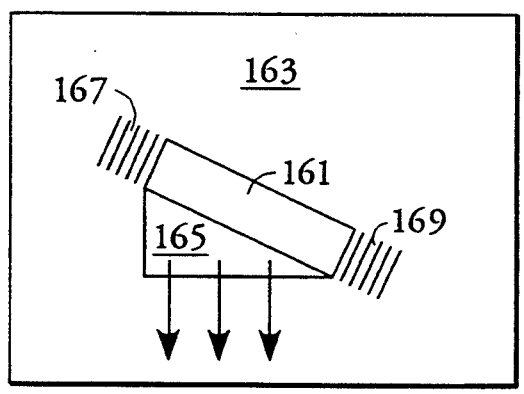
FIGS. 14-16 are top plan views of two laser oscillators and a MOPA device having a leaky waveguide beam expander at least partially within the laser cavity.
Figure 15:
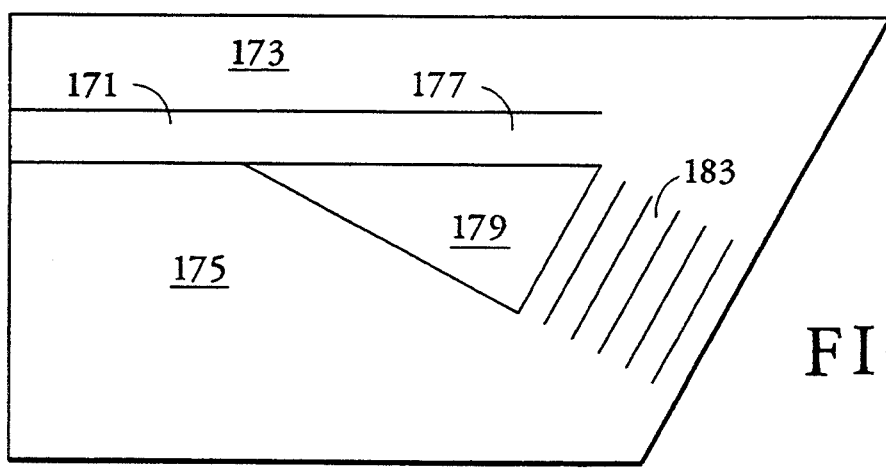
Figure 16:
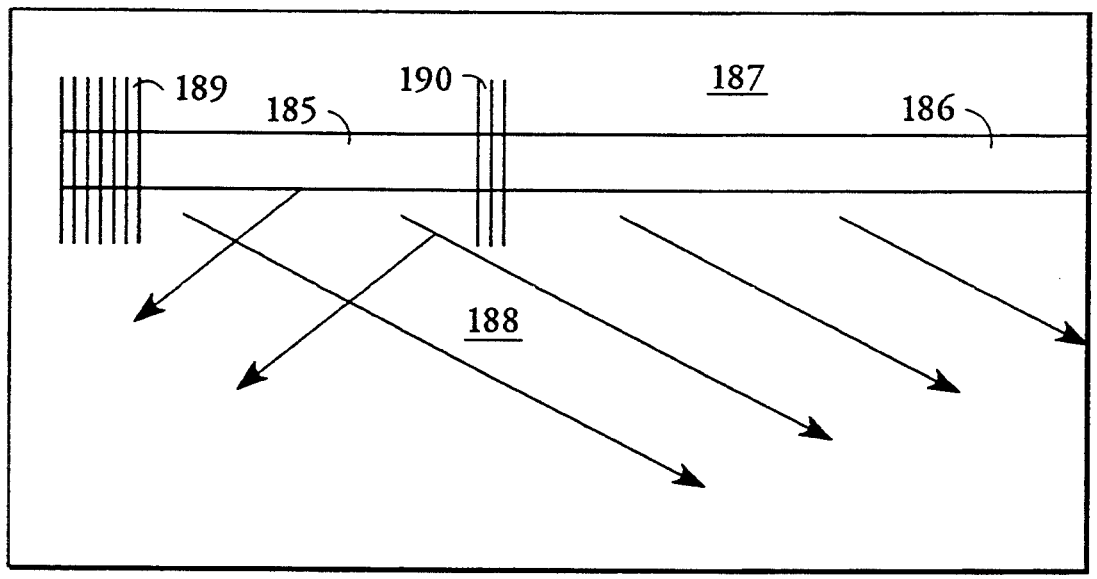

With reference to FIGS. 14–16, the leaky waveguide beam expander can also be included inside the laser oscillator. In FIG. 14, a single mode leaky waveguide core 161, bounded by cladding region 163 of lesser refractive index on one side and a lateral radiation receiving region 165 of higher refractive index on the opposite side, is located entirely within a resonant optical cavity defined by a pair of reflectors 167 and 169, which in this instance are shown as two DBR gratings. Laser oscillation occurs for the light that remains in the waveguide core 161. The beam expander elements 161, 163 and 165 act as an output coupler for the laser oscillator, providing a coherent wide output beam emitted from the radiation receiving region 165.

In FIG. 15, the beam expander acts as a mode converter within a folded cavity. The cavity, defined by reflectors 181 and 183, shown here as a cleaved facet and a DBR grating, includes a single mode waveguide 171 bounded on both sides by lower refractive index cladding regions 173 and 175 and a leaky waveguide 177 bounded on one side by the cladding region 173 and on the opposite side by a higher refractive index, lateral radiation receiving, broad area gain region 179. The reflector 183 is located at one end of the radiation receiving gain region 179. The single mode waveguide 171 acts as a mode filter to select and maintain a single spatial mode of oscillation within the cavity. The beam expander elements 173, 177 and 179 transfer the light propagating in the single mode waveguide 171 to the broad area gain region 179 in a coherent fashion and also couples the reflected light back into the single mode waveguide 171. The output beam emitted through reflector 183 has the broad width corresponding to the aperture of the broad area gain region 179. As a result, higher output power levels and significantly reduced beam divergence are obtained.

In FIG. 16, the leaky waveguide beam expander is located both inside and outside the resonant optical cavity of the laser oscillator. The cavity defined by a pair of reflectors 189 and 190, here shown as a high reflection DBR grating 189 and a low reflectivity DBR grating 190. A single-mode leaky waveguide core consists of a first segment 185 located between the reflectors 189 and 190, and a second segment 186 located outside the cavity coupled to the intracavity first segment 185 through the reflector 190. Since both segments 185 and 186 are formed together, they are self-aligned and mode matched. Both segments 185 and 186 are bounded on one side by a lower refractive index cladding region 187 and on the other side by a higher refractive index, broad area, lateral radiation receiving region 188. Typical refractive indices are $n_1 = 3.3310$ for the cladding region 187, $n_2 = 3.3514$ for the leaky waveguide core segments 185 and 186 and $n_3 = 3.4525$ for the radiation receiving region 188. As previously noted above for FIGS. 4a–c, the higher index region 188 can be fabricated by providing a GaAs index load layer proximate to the active region layer or layers. The waveguide segments 185 and 186 are both electrically pumped to form a laser oscillator followed by an integral single mode optical power amplifier, i.e. a MOPA device. The radiation receiving region 188 may be pumped as well to provide broad area amplification of the lateral radiation. Incorporating the beam expander into both the laser oscillator and power amplifier produces a much wider output beam than incorporating it into only one stage of the MOPA device, for higher power and low divergence outputs.

Figure 17:
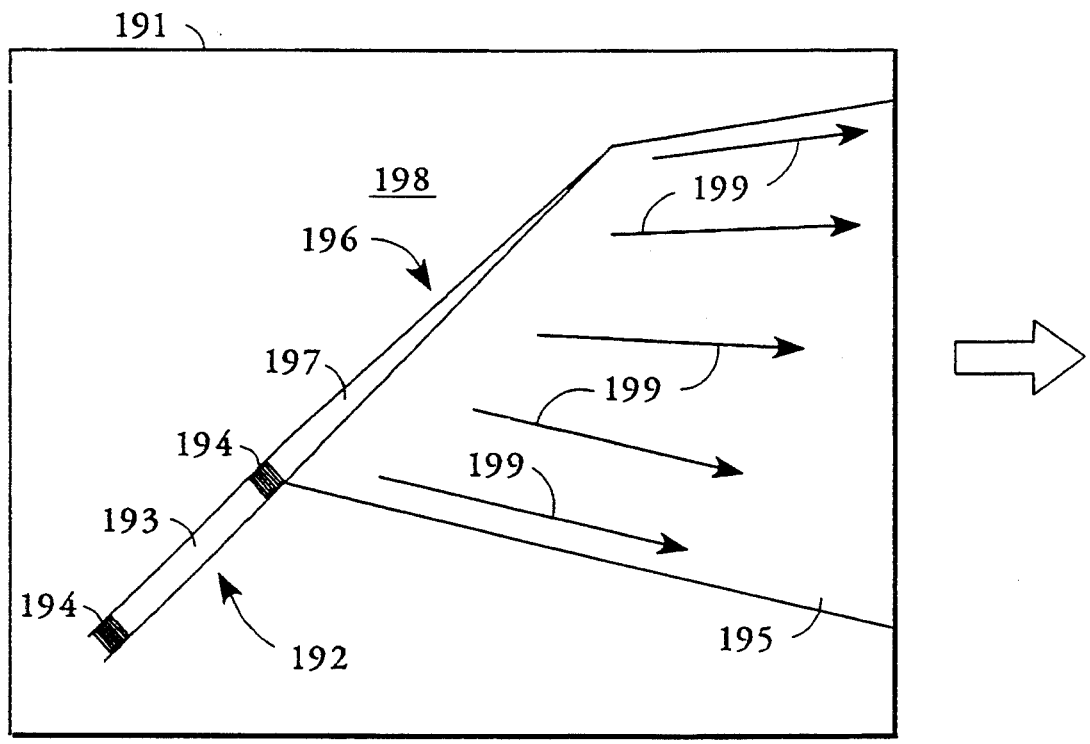
FIGS. 17 and 18 are top plan views of further MOPA device embodiments of the present invention.

With reference to FIG. 17, a monolithic MOPA device 191 in accord with the present invention comprises, as in previously described embodiments of the invention, a laser oscillator 192, typically having a single mode gain region 193 and DBR grating reflectors 194, a broad area power amplifier 195, and a transverse leaky waveguide beam expander 196 incorporated between the laser oscillator 192 and amplifier 195 for receiving a coherent light beam from the laser oscillator 192 and laterally radiating the light as an expanded beam 199 into the amplifier 195. Like the other beam expanders described above, the expander 196 has an elongated antiguide core 197 and a radiated-wave receiving region 195 of higher refractive index than the antiguide core 197 laterally disposed along one side of the antiguide core 197. In the particular example seen in FIG. 17, the optical power amplifier 195 doubles as the radiation receiving region. The other side of the antiguide core 197 from the lateral radiated wave receiving region 195 can be a lower refractive index cladding region 198, as shown, a set of antiresonant layers, as previously described in FIGS. 3 and 5, or another radiated wave receiving region like that seen in FIGS. 7 and 10.

However, unlike previous beam expander embodiments, the antiguide core 197 is tapered in width along its length, so that the core width gradually decreases from a first width that substantially equals the width of gain region 193 at the output of the laser oscillator 192 to a substantially narrower width at the opposite end of the antiguide core 197. The taper results in a gradual change in the effective refractive index of the antiguide core 197 along its length, such that the light propagating in the antiguide 197 is laterally radiated from the core at an ever decreasing angle. Thus, the laterally radiated light emerges into the radiation receiving, broad area amplifier region 195 as a diverging beam 199. The amplifier region 195 is preferably flared slightly in order to accommodate the gradually expanding width of the diverging beam 199 along the entire length of the amplifier region 195. It has been learned that when a substantially collimated wide beam enters, propagates in and is amplified by a broad area optical power amplifier, incoherent optical filaments can form spontaneously and be sustained within the optical amplifier. However, it has also been learned that a diverging beam suppresses stable filament formation in flared amplifiers. Thus, the tapered beam expander 196 provides a laterally radiated, expanded, diverging beam 199 that suppresses the formation of optical filaments in the amplifier region 195. The laser oscillator 192 in the monolithic MOPA device 191 of FIG. 17 can be moved off the chip to form a broad area, diverging beam amplifier with tapered beam expander.

Figure 18:
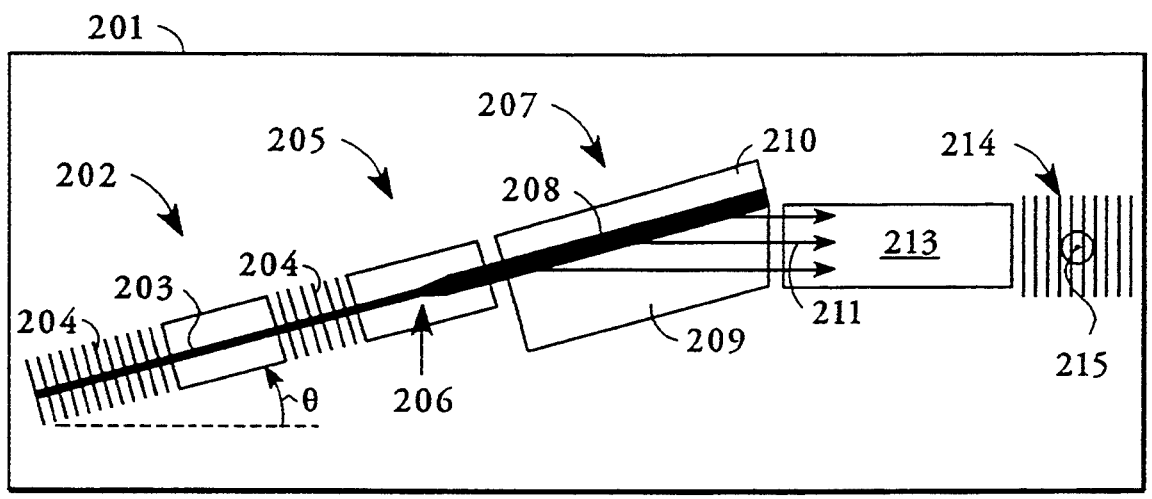

With reference to FIG. 18, another monolithically integrated MOPA device 201 of the present invention includes a laser oscillator 202, preferably one with a single mode gain region 203 and a pair of DBR grating reflectors 204, a preamplifier section 205 coupled to an output of the laser oscillator 202, a leaky waveguide coherent beam expander 207, a broad area optical power amplifier 213 coupled to receive laterally radiated lightwaves from the beam expander 207, and an output coupler 214, preferably a passive detuned grating surface emitter receiving amplified light from the amplifier region 213 and emitting a low divergence, low aspect ratio (typically about 2:1) beam 215 through an upper surface of the monolithic MOPA device 201. In this embodiment, the preamplifier 205 has a flared waveguide 206 that adiabatically expands the width of the light beam it receives from the laser oscillator 202. Typically, the flared waveguide expands from an input width of about 4 $\mu$m to an output width of about 6 $\mu$m, but other amounts of expansion are also possible. The beam expander 207 has a leaky waveguide or antiguide core 208 and a radiated wave receiving region 209 disposed on one side of the antiguide 208 with an effective refractive index that is higher than that of the antiguide core 208. On the other side of the antiguide 208 may be a lower index cladding region 210, antiresonant layers or another radiation receiving region. The antiguide core 208 has a width that matched the output width of the flared waveguide 206, i.e., typically about 6 $\mu$m, and a length, typically about 1000 $\mu$m, sufficient to expand the light beam by means of lateral radiation to a width of about 200 $\mu$m.

The radiated optical power represents a significant loss with respect to the modal power remaining in the antiguide 208. If, as is often the case, the beam expander 207 is not pumped sufficiently to maintain the optical power level along the length of the antiguide 208, but is merely pumped to transparency, or is constructed as a passive leaky waveguide, then the amount of power radiated from the beam expander 207 is given by an exponential decay with distance z along the length of the antiguide 208, i.e., by $P_{rad} \approx P_i e^{-\alpha z}$, where $P_i$ is the optical power input into the beam expander 207 and $\alpha$ is the loss coefficient for the injected mode. The optical power distribution across the width of the input of the optical amplifier 213 which receives the laterally radiated light is given by $P(x) = e^{\alpha_p L \cos \Theta} e^{(\alpha_p \cos \Theta - \alpha)} \times \csc \Theta$, where $\alpha$ is the radiation loss from the leaky waveguide 208, $\Theta = \cos^{-1}(n_2/n_3)$ is the lateral radiation angle, $\alpha_p$ is the loss coefficient for the radiation receiving region 209 and L is the length of the radiation receiving region 209. The $(1/e^2)$ points define the near field beam width as $\Delta x = 2 \sin \Theta/(\alpha - \alpha_p \cos \Theta)$. From this it can be seen that one approach to increasing the beam width would be to increase the lateral radiation angle $\Theta$ by increasing the effective refractive index $n_3$ in the index loaded radiation receiving region 209. However, this modification, which can be accomplished by moving the index loading layer closer to the active region, would severely distort the optical mode in the radiation receiving region 209, resulting in significantly higher scattering losses into and out of the region 209. Accordingly, the preferred solution for widening the expanded beam is to widen the width of the antiguide core 208 by means of the flared preamplifier waveguide 206, as shown in FIG. 18, thereby reducing the radiation loss $\alpha$. For a given optical mode order, wavelength, core refractive index and radiation receiving region refractive index, the radiation loss $\alpha$ is inversely proportional to the cube of the antiguide core's width W, i.e. $\alpha \propto W^{-3}$. By expanding the beam from about 4 $\mu$m width to about 6 $\mu$m width in the flared preamplifier, near field lateral radiation widths $\Delta x$ can be expanded from about 130 $\mu$m to values in excess of 200 $\mu$m. Coupling this light into a 200 $\mu$m wide by 1250 $\mu$m long or longer power amplifier region 213 will enable over 2 W cw of total output power in the 830–870 nm range to be obtained.

We claim:

1. A coherent light source comprising
   at least one laser oscillator
   a leaky waveguide beam expander having only one elongated antiguide core of a first effective refractive index which is optically coupled to said laser oscillator to receive lightwaves therefrom, said beam expander also having at least one radiated-wave receiving region of at least a second effective refractive index that is greater than said first refractive index, said radiated-wave receiving region laterally disposed on at least one side of said antiguide core to receive lightwaves radiated laterally out of a length of said antiguide core, said laterally radiated lightwaves forming a wide light beam propagating laterally in said receiving region from said antiguide core to an output end of said receiving region, and
   a single broad area optical power amplifier region optically coupled to said beam expander to receive said laterally propagating wide light beam from said output end of said radiated-wave receiving region, said amplifier region having excitation means associated therewith for amplifying said lightwaves as said beam continues to propagate in a lateral direction along a length of said amplifier region.

2. The coherent light source of claim 1 wherein an active surface emitting grating is disposed within said amplifier region.

3. The coherent light source of claim 1 wherein a passive grating output coupler is disposed in the path of amplified lightwaves at an end of said amplifier region.

4. The coherent light source of claim 1 wherein a reflector is disposed at an end of said amplifier region in the path of lightwaves that have passed once through said amplifier region, said reflector oriented at a nonperpendicular angle relative to said path to reflect said lightwaves back into said amplifier region along a second path to further amplify said lightwaves.

5. A coherent light source comprising
   at least one laser oscillator,
   at least one leaky waveguide beam expander having an elongated antiguide core of at least a first effective refractive index which is opticallly coupled to said laser oscillator to receive lightwaves therefrom, said beam expander also having at least one radiated-wave receiving region of at least a second effective refractive index that is greater than said first refractive index, said radiated-wave receiving region laterally disposed on at least one side of said antiguide core to receive lightwaves radiated laterally out of said antiguide core, and
   at least one broad area optical power amplifier region optically coupled to said at least one beam expander to receive said laterally radiated lightwaves from said beam expander, said amplifier region having excitation means associated therewith for amplifying said lightwaves, wherein said elongated antiguide core is tapered with a core width that decreases along the length of the antiguide core, said broad area optical power amplifier receiving diverging lightwaves from said beam expander.

6. The coherent light source of claim 5 wherein said broad area amplifier is flared with an amplifier width that increases along the length of the amplifier.

7. A coherent light source comprising
   at least one laser oscillator,
   at least one leaky waveguide beam expander having an elongated antiguide core of at least a first effective refractive index which is optically coupled to said laser oscillator to receive lightwaves therefrom, said beam expander also having at least one radiated-wave receiving region of at least a second effective refractive index that is greater than said first refractive index, said radiated-wave receiving region laterally disposed on at least one side of said antiguide core to receive lightwaves radiated laterally out of said antiguide core, and at least one single spatial mode preamplifier section disposed between each said laser oscillator and said at least one beam expander, said preamplifier section having conductive contact means for amplifying lightwaves received from said laser oscillator.

8. The coherent light source of claim 7 wherein said preamplifier section has a flared waveguide with a greater preamplifier width at an input end of said beam expander than at an output end of said laser oscillator.

9. A coherent light source comprising at least one laser oscillator, a leaky waveguide beam expander having only one elongated antiguide core of a first effective refractive index which is optically coupled to said laser oscillator to receive lightwaves therefrom, said beam expander also having at least one radiated-wave receiving region of at least a second effective refractive index that is greater than said first refractive index, said radiated-wave receiving region laterally disposed on at least one side of said antiguide core to receive lightwaves radiated laterally out of a length of said antiguide core, said laterally radiated lightwaves forming a wide light beam propagating laterally in said receiving region from said antiguide core to an output end of said receiving region, the opposite side of said antiguide core from said radiated-wave receiving region having a cladding region with a third refractive index that is less than said first refractive index of said antiguide core.

10. A coherent light source comprising
at least one laser oscillator, and
at least one leaky waveguide beam expander having an elongated antiguide core of at least a first effective refractive index which is optically coupled to said laser oscillator to receive lightwaves therefrom, said beam expander also having at least one radiated-wave receiving region of at least a second effective refractive index that is greater than said first refractive index, said radiated-wave receiving region laterally disposed on at least one side of said antiguide core to receive lightwaves radiated laterally out of said antiguide core, wherein the opposite side of said antiguide core from said radiated-wave receiving region has a plurality of antiresonant regions of alternating first and second refractive indices and half wavelength widths so as to reflect lightwaves radiated into said antiresonant regions back towards said radiated-wave receiving region.

11. A coherent light source comprising
at least one laser oscillator, and
at least one leaky waveguide beam expander having an elongated antiguide core of at least a first effective refractive index which is optically coupled to said laser oscillator to receive lightwaves therefrom, said beam expander also having at least one radiated-wave receiving region of at least a second effective refractive index that is greater than said first refractive index, said radiated-wave receiving region laterally disposed on at least one side of said antiguide core to receive lightwaves radiated laterally out of said antiguide core, wherein said radiated-wave receiving region has an index loading layer formed in a transverse cladding layer proximate to an active region, said index loading layer having a refractive index that is higher than that of said cladding layer.

12. A broad area coherent light source comprising
a semiconductor chip with an active gain region, a single elongated antiguide core associated with said gain region for guiding lightwaves generated in said gain region, and a radiated-wave receiving region disposed on a side of said antiguide core with a higher effective refractive index than an effective refractive index of said antiguide core to receive lightwaves laterally radiated from a length of said antiguide core, said laterally radiated lightwaves forming a wide light beam propagating laterally in said receiving region from said antiguide core to an output end of said receiving region, feedback means for defining a resonant optical cavity, said antiguide core and said radiated-wave receiving region at least partially located within said cavity, and excitation means for pumping said active gain region.

13. The coherent light source of claim 12 wherein said feedback means bound said antiguide core with a pair of reflectors located at each end of said antiguide core, said radiated-wave receiving region forming a laterally disposed broad area output coupler for said lightwaves generated in and laterally radiated from said gain region.

14. The coherent light source of claim 12 wherein said feedback means comprises a first reflector at an end of said antiguide core, and a second partial reflector at an end of said radiated-wave receiving region providing reflective feedback of said wide light beam back into said antiguide core, said second partial reflector also forming a laterally disposed broad area output coupler for said wide light beam.

15. The coherent light source of claim 12 wherein said antiguide core and said radiated-wave receiving region are entirely within said resonant optical cavity.

16. A broad area MOPA device comprising
a semiconductor chip with an active gain region, an elongated antiguide core associated with said gain region for guiding lightwaves generated in said gain region, and a radiated-wave receiving region disposed on a side of said antiguide core with a higher effective refractive index than an effective refractive index of said antiguide core to receive lightwaves laterally radiated from said antiguide core, excitation means for pumping said active gain region, and feedback means for defining a resonant optical cavity, wherein said antiguide core and said radiated-wave receiving region are partially within and partially outside of said resonant optical cavity, with one reflector of said feedback means positioned along said antiguide core and another reflector of said feedback means positioned at an end of said antiguide core.

17. A semiconductor broad area light amplifying device comprising
a single elongated antiguide core of a first effective refractive index adapted to receive a narrow light beam from a light source, a radiated-wave receiving region disposed along at least one side of said antiguide core with a second effective refractive index larger than said first refractive index to receive light laterally radiated from a length of said antiguide core, said laterally radiated light forming a wide light beam propagating laterally in said receiving region from said antiguide core to an output end of said receiving regions, and a broad area optical power amplifier laterally disposed at said output end of said radiated-wave receiving region to receive said wide light beam therefrom and amplify said beam as it continues to propagate laterally in said amplifier.

18. A monolithic, broad area, master oscillator power amplifier (MOPA) device comprising a single spatial mode laser oscillator, a broad area optical power amplifier, and a transverse leaky waveguide coherent beam expander coupled between said laser oscillator and said optical power amplifier, said beam expander having an elongated antiguide core of a first refractive index disposed to receive and guide lightwaves from said single spatial mode laser oscillator, said beam expander also having a radiated-wave receiving region laterally disposed along at least one side of said antiguide core and having a second refractive index greater than said first refractive index of said antiguide core to receive lightwaves laterally radiated from said antiguide core as a wide coherent beam, said broad area optical power amplifier disposed at an output of said beam expander to receive and amplify said wide coherent beam from said radiated-wave receiving region.

19. The MOPA device of claim 18 wherein the opposite side of said antiguide core from said radiated-wave receiving region has a cladding region with a third refractive index that is less than said first refractive index of said antiguide core.

20. The MOPA device of claim 18 wherein the opposite side of said antiguide core from said radiated-wave receiving region has a plurality of antiresonant regions of alternating first and second refractive indices and half-wavelength widths so as to reflect lightwaves radiated into said antiresonant regions back towards said radiated-wave receiving region.

21. The MOPA device of claim 18 wherein said radiated-wave receiving region has an index loading layer formed in a transverse cladding layer proximate to an active light guiding region, said index loading layer having a refractive index that is higher than that of said cladding layer.

22. The MOPA device of claim 18 wherein said elongated antiguide core is tapered with a core width that decreases along the length of the antiguide core, said broad area optical power amplifier being flared with an amplifier width that increases along the length of the amplifier, said amplifier receiving diverging lightwaves from said beam expander.

23. The MOPA device of claim 18 further comprising a single spatial mode preamplifier section disposed between said laser oscillator and said beam expander, said preamplifier section having conductive contact means for amplifying lightwaves received from said laser oscillator.

24. The MOPA device of claim 23 wherein said preamplifier section has a flared waveguide with a greater preamplifier width at an input end of said beam expander than at an output end of said laser oscillator.

25. The MOPA device of claim 18 wherein said broad area optical power amplifier has an active surface emitting grating disposed therein.

26. The MOPA device of claim 18 wherein a reflector is disposed on an end of said broad area optical power amplifier, said reflector disposed and oriented so as to reflect amplified lightwaves that have passed once through said amplifier along a second path back into said amplifier to further amplify said lightwaves.

27. The MOPA device of claim 18 wherein a passive grating output coupler is disposed in the path of amplifier lightwaves at an end of said amplifier.

* * * * *